(12) United States Patent
Hsu

(10) Patent No.: US 7,608,923 B2
(45) Date of Patent: Oct. 27, 2009

(54) ELECTRONIC DEVICE WITH FLEXIBLE HEAT SPREADER

(75) Inventor: Chi-Hsing Hsu, Taipei County (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 11/871,207

(22) Filed: Oct. 12, 2007

(65) Prior Publication Data

US 2009/0045505 A1 Feb. 19, 2009

(30) Foreign Application Priority Data

Aug. 15, 2007 (TW) ............................... 96130128 A

(51) Int. Cl.
*H01L 23/10* (2006.01)
*H01L 23/34* (2006.01)
*H01L 23/495* (2006.01)
*H01L 23/48* (2006.01)
*H01L 23/12* (2006.01)

(52) U.S. Cl. .............. 257/707; 257/675; 257/688; 257/706; 257/712; 257/713; 257/720; 257/E23.101; 257/E23.102; 257/E23.104

(58) Field of Classification Search ............... 257/675, 257/688, 706–707, 712–713, 720, E23.101, 257/E23.102, E23.104
See application file for complete search history.

(56) References Cited

U.S. PATENT DOCUMENTS

| | | | | |
|---|---|---|---|---|
| 4,849,856 A | * | 7/1989 | Funari et al. | 361/719 |
| 5,162,975 A | * | 11/1992 | Matta et al. | 361/720 |
| 5,315,480 A | * | 5/1994 | Samarov et al. | 361/705 |
| 5,796,169 A | * | 8/1998 | Dockerty et al. | 257/780 |
| 5,991,155 A | * | 11/1999 | Kobayashi et al. | 361/705 |
| 6,025,992 A | * | 2/2000 | Dodge et al. | 361/704 |
| 6,449,159 B1 | * | 9/2002 | Haba | 361/707 |
| 6,544,812 B1 | * | 4/2003 | Camenforte et al. | 438/106 |
| 6,709,898 B1 | * | 3/2004 | Ma et al. | 438/122 |
| 6,794,223 B2 | * | 9/2004 | Ma et al. | 438/122 |
| 7,007,741 B2 | * | 3/2006 | Sen et al. | 165/46 |
| 7,193,316 B2 | * | 3/2007 | Mongia et al. | 257/712 |
| 2005/0039884 A1 | * | 2/2005 | Pawlenko et al. | 165/80.4 |
| 2005/0112796 A1 | * | 5/2005 | Ararao et al. | 438/106 |
| 2005/0276024 A1 | * | 12/2005 | Westbury | 361/749 |
| 2006/0098411 A1 | * | 5/2006 | Lee et al. | 361/704 |
| 2006/0104034 A1 | | 5/2006 | Tsai et al. | |
| 2008/0150125 A1 | * | 6/2008 | Braunisch et al. | 257/712 |
| 2008/0246130 A1 | * | 10/2008 | Carney et al. | 257/675 |

FOREIGN PATENT DOCUMENTS

| | | |
|---|---|---|
| CN | 1731916 | 2/2006 |
| CN | 1748011 | 3/2006 |
| JP | 08139235 A * | 5/1996 |

* cited by examiner

*Primary Examiner*—Ida M Soward
(74) *Attorney, Agent, or Firm*—Thomas, Kayden, Horstemeyer & Risley

(57) ABSTRACT

A package module is provided. The package module includes a substrate having a surface including a die region. A die is disposed in the die region of the surface on the substrate. A flexible heat spreader conformally covers the surface of the substrate and the die. The invention also discloses an electronic device with the package module.

20 Claims, 6 Drawing Sheets

ELECTRONIC DEVICE WITH FLEXIBLE HEAT SPREADER

BACKGROUND OF THE INVENTION

1. Field of the Invention

The invention relates to electronic package technology, and in particular, to a package module having a flexible heat spreader capable of reducing thermal stress and increasing heat dissipation.

2. Description of the Related Art

Demand for small, high performance portable electronic products such as mobile phones, portable computers, and the like have driven the industry to increase integration on semiconductor dice. Accordingly, the industry is achieving high integration by turning to 3D packaging by combining assembly technologies including wire bonding or flip chip to stack die packages to form a multi-package module (MPM).

MPM, a current assembly technology, integrates different dice functions, such as microprocessors or memory, logic, optic ICs, instead of placing individual packages onto a large printed circuit board (PCB). MPM, however, has a much higher power density than an individual single die package. Thus, thermal management is a key factor for successful development.

Conventional methods to combat the presence of heat during device operation typically include providing a heat spreader in thermal contact with IC chips in the package module. FIG. 1 illustrates a conventional electronic device with an MPM. The electronic device comprises an MPM 100 comprising a substrate 12 and mounted on a PCB 101. The upper and lower surfaces of the substrate 12 have dice 16 and 14 with different functions thereon, respectively, to create the MPM 100. The lower surface of the substrate 12 comprises a plurality of bumps 10 thereon to correspondingly connect to the bonding pads 11 on the PCB 101 for electrical connection between the dice 16 and 14 and the PCB 101. In the MPM 100, heat generated from the die 16 can be dissipated by a heat spreading device. For example, a heat spreader 20 contacts the upper surface of the die 16 through an adhesion layer 17. Moreover, a stiffener 18 is disposed on the substrate 12 and surrounds the die 16. The heat spreader 20 and the substrate 12 are fixed by the stiffener 18 through adhesion layers 15 and 17, in which the stiffener 18 serves as a hold for the heat spreader 20.

In such an electronic device, the gap between the die 14 and the PCB 101 is too narrow, however, to dissipate the generated heat from the die 14. Accordingly, low power chips are typically disposed on the lower surface of the substrate, thus hindering circuit design flexibility. Moreover, since the heat spreader 20 and the stiffener 18 typically comprise rigid materials, delamination of the heat spreader 20 and crack of the dice 16 may be occur due to the thermal stress generated from the thermal processes. Thus, device reliability is reduced. Additionally, MPMs with different sizes require stiffeners with different sizes, increasing manufacturing costs.

Accordingly, there is a need to develop a package module with an efficient heat spreader that does not suffer from the deficiencies found in the prior art.

BRIEF SUMMARY OF INVENTION

A detailed description is given in the following embodiments with reference to the accompanying drawings.

A package module and an electronic device are provided. An embodiment of a package module comprises a substrate having a surface comprising a die region. A die is disposed in the die region of the surface on the substrate. A flexible heat spreader conformally covers the surface of the substrate and the die.

An embodiment of an electronic device comprises a package module and a circuit board. The package module comprises a substrate having a first surface comprising a die region, and an opposing second surface. A plurality of solder balls is on the second surface of the substrate and arranged in an array. A die is disposed in the die region of the first surface on the substrate. A flexible heat spreader conformally covers the first surface of the substrate and the die. The circuit board has a plurality of bonding pads correspondingly bonded to the plurality of solder balls.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims. The electronic device with a package module of the invention will be described in the following with reference to the accompanying drawings.

Figure 1:
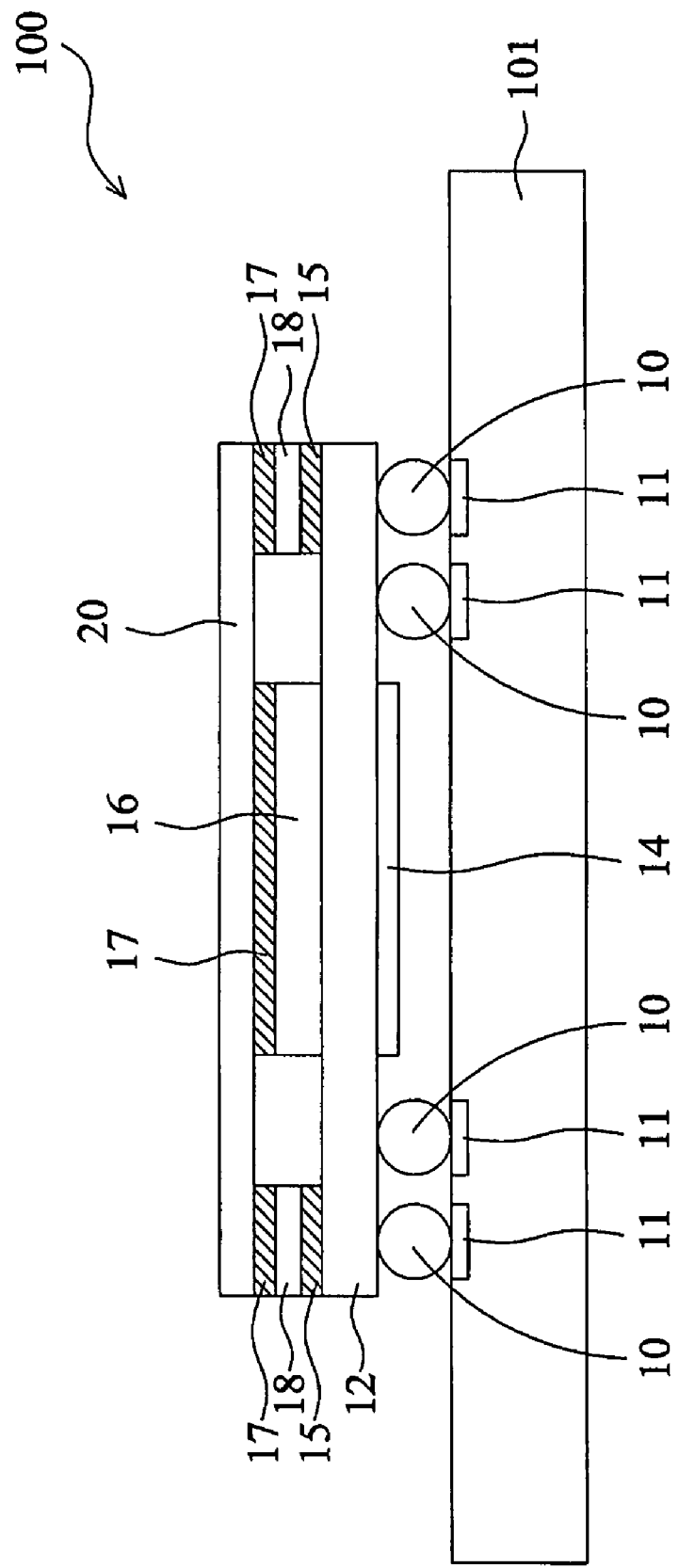
FIG. 1 is a cross-section of a conventional electronic device with a package module.
Figure 2:
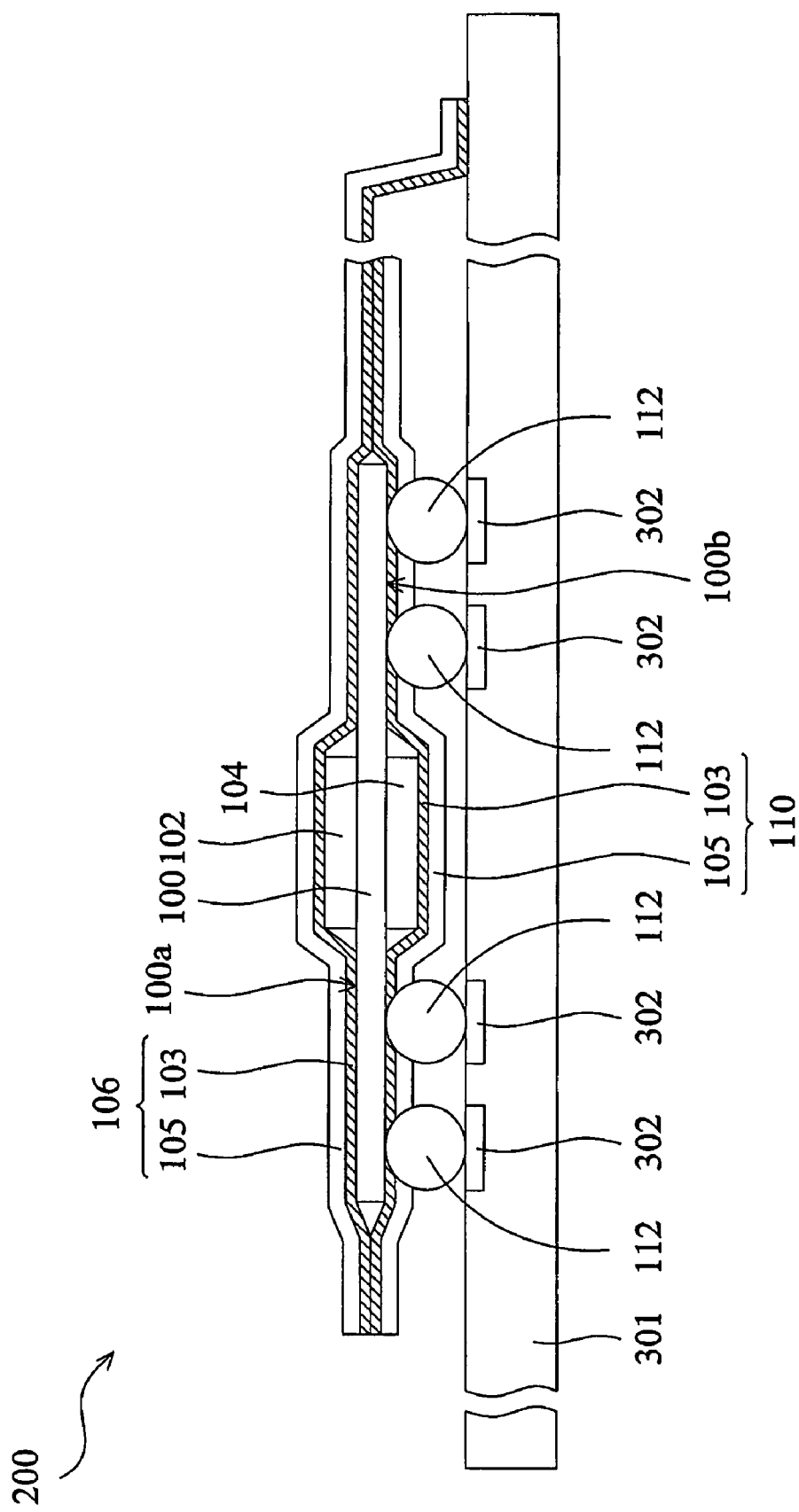
FIG. 2 is a cross-section of an embodiment of an electronic device with a package module according to the invention.
Figure 3:
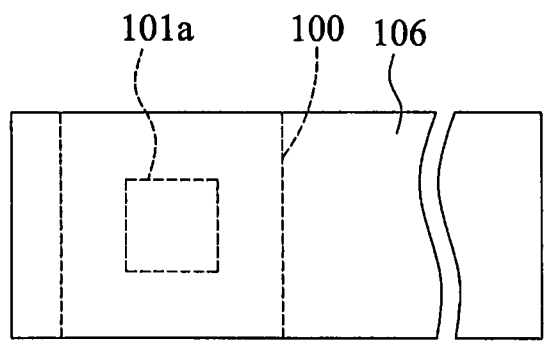
FIG. 3 is a top plan view of an embodiment of a package module according to the invention.
Figure 4:
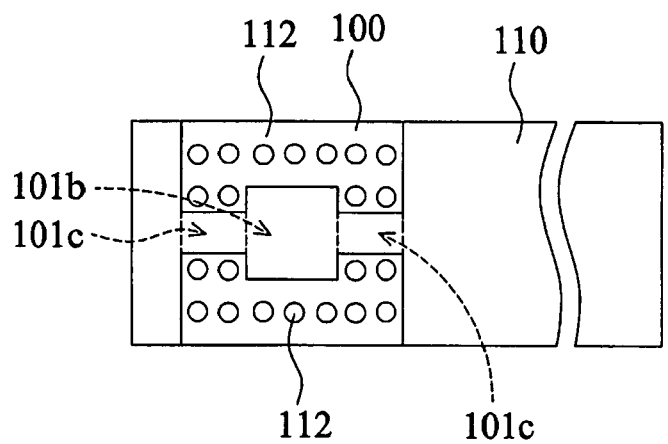
FIG. 4 is a bottom plan view of an embodiment of a package module according to the invention.
Figure 5:
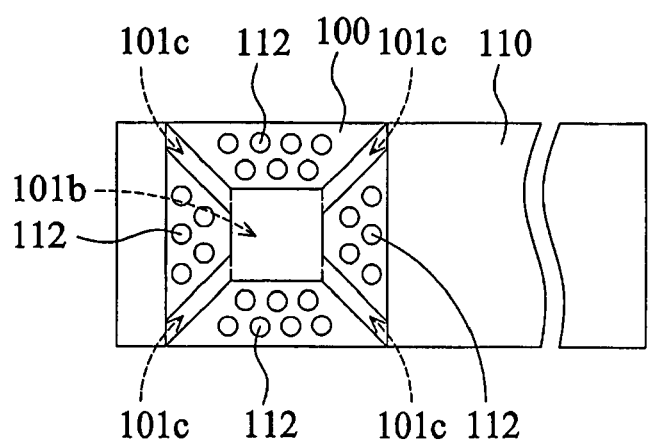
FIG. 5 is a bottom plan view of another embodiment of a package module according to the invention.

FIG. 2 illustrates an embodiment of an electronic device with a multi-package module according to the invention. The electronic device comprises a package module 200 and a circuit board 301, such as a PCB. The package module 200 comprises a substrate 100 (e.g., package substrate or IC carrier), a plurality of solder balls 112, dice 102 and 104, and flexible heat spreaders 106 and 110. In the embodiment, the substrate 100 may comprise plastic, ceramic, inorganic or organic material. Moreover, the substrate 100 has a first surface and a second surface. The first and second surfaces may be upper and lower surfaces 100a and 100b, respectively. Here, the lower surface 100b represents a surface facing the surface of the circuit board 301 and the upper surface 100a represents the surface opposite to the lower surface 100b. Referring to FIGS. 3 and 4, which are top and bottom plan views of the package module according to the invention, respectively, the upper surface 100a of the substrate 100 has a die region 101a and the lower surface 100b of the substrate 100 has a die region 101b and thermal channel regions 101c. Typically, the die regions 101a and 101b are substantially at the center of the substrate 100. Unlike the conventional package substrate, the lower surface 100b of the substrate 100 has thermal channel regions 101c outwardly extending to the edges or corners of the substrate 100 from the die region 101b. For example, the thermal channel regions 101c outwardly extend to two opposing edges of the substrate 100, respectively, from two opposing edges of the rectangular die region 101b, as shown in FIG. 4. In another embodiment, the thermal channel regions 101c may outwardly extend to four corners of the substrate 100, respectively, from four corners of the rectangular die region 101b, as shown in FIG. 5. It will be apparent to those skilled in the art that the substrate 100 may comprise one or more thermal channel region(s) outwardly extending to the edge(s) or corner(s) of the substrate 100 from the edge(s) or corner(s) of the die region and it is understood that the invention is not limited to FIGS. 4 and 5.

Referring to FIGS. 2, 3, 4, and 5, dice 102 and 104 with different functions may be respectively mounted in the die region 101a of the upper surface 100a and the die region 101b of the lower surface 100b of the substrate 100 by the same or different electronic packages. For example, dice 102 and 104 may respectively be mounted on the substrate 100 by flip chip or wire bonding.

The plurality of solder balls 112 is arranged in an array and located on the lower surface 100b of the substrate 100 except in the die region 101b and the thermal channel regions 101c, to transmit signals to external circuits from the dice 102 and 104. The interval between the bumps 112 is narrower than a width of the thermal channel region 101c.

Flexible heat spreaders 106 and 110 are disposed on the upper and lower surfaces 100a and 100b of the substrate 100, respectively. Unlike the conventional rigid heat spreader using the stiffener as a hold, the flexible heat spreader 106 conformally covers portions of the upper surface 100a of the substrate 100 and the die 102 in the die region 101a, and the flexible heat spreader 110 conformally covers the thermal channel regions 101c of the lower surface 100b of the substrate 100 and the die 104 in the die region 101b without contacting the plurality of solder balls 112. In the embodiment, the conformal heat spreader 106 may completely or partially cover the upper surface 100a of the substrate 100 and the surface of the die 102 in the die region 101a. Moreover, the flexible heat spreaders 106 and 110 may outwardly extend from at least one edge of the substrate 100 and bond together. For example, the flexible heat spreaders 106 and 110 may outwardly extend from two opposing edges of the substrate 100 and bond together.

Figure 6:
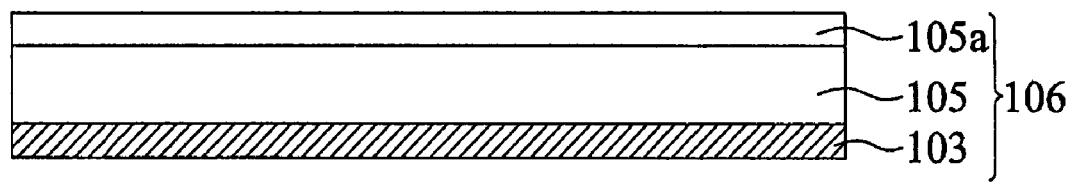
FIG. 6 is a cross-section of an embodiment of a flexible heat spreader according to the invention.
Figure 7:
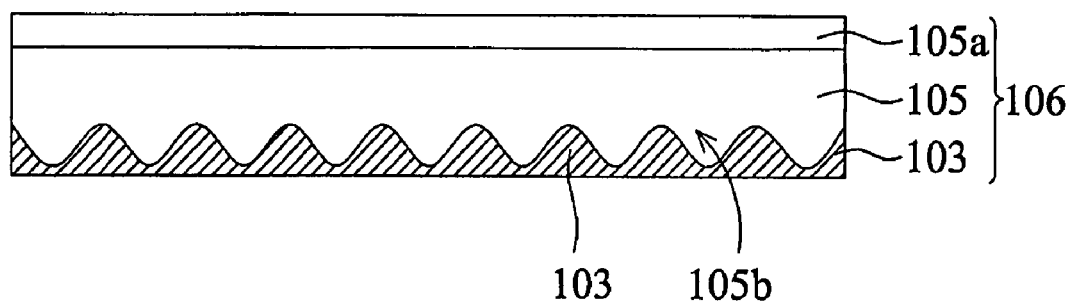
FIG. 7 is a cross-section of another embodiment of a flexible heat spreader according to the invention.

In the embodiment, each of the flexible heat spreaders 106 and 110 may comprise a flexible thermally conductive layer 105 and an underlying adhesion layer 103, as shown in FIG. 6. The flexible thermally conductive layer 105 may comprise a metal, such as copper, with a thickness less than 30 µm or a carbon tube prepreg material. An additional protective layer 105a comprising, for example, nickel or anode oxide material is formed on the surface of the flexible thermally conductive layer 105 opposite to the adhesion layer 103 while using copper for the flexible thermally conductive layer 105. That is, the protective layer 105a is separated from the adhesion layer 103 by the flexible thermally conductive layer 105. The adhesion layer 103 interposed between the flexible thermally conductive layer 105 and the substrate 100 may comprise B-stage resin, polyimide (PI), or other adhesion materials known in the art and be employed to bond the flexible thermally conductive layer 105 onto the substrate 100 and the dice 102 and 104. In particular, the use of the flexible B-stage resin is more sufficient for conformally covering the substrate 100 by the flexible thermally conductive layer 105. Additionally, the flexible thermally conductive layer 105 has a substantially flat surface, such that the adhesion layer 103 can separate the dice 102 and 104 from the flexible thermally conductive layer 105. In another embodiment, however, the surface of the flexible thermally conductive layer 105 has a plurality of convex patterns 105b to form a rough surface, as shown in FIG. 7. When the flexible heat spreaders 106 and 110 are bonded to the substrate 100 by pressure, the plurality of convex patterns 105b of the flexible thermally conductive layer 105 may pass through the adhesion layer 103 so as to directly contact the first and second dice 102 and 104, thereby further increasing heat dissipation.

The circuit board 301 has a plurality of bonding pads 302 thereon, correspondingly bonded to the plurality of solder balls 112, thereby electronically connecting the circuit board 301 and the dice 102 and 104. Typically, the circuit board 301 comprises at least one or more metal layers and at least one or more insulating layers, in which the metal layer may serve as a signal layer, a power layer, and/or a grounding layer. In order to simplify the diagram, a flat substrate is depicted. Additionally, the circuit board 301 may comprise a thermal dissipation device (not shown) thereon, and one end of the flexible heat spreader 106 or 110 may be bonded to the thermal dissipation device of the circuit board 301, thereby increasing heat dissipation of the electronic device. Hereinafter, to simplify the diagram, only an exemplary embodiment of one end of the flexible heat spreader 106 bonded to the circuit board 301 is depicted.

Figure 8:
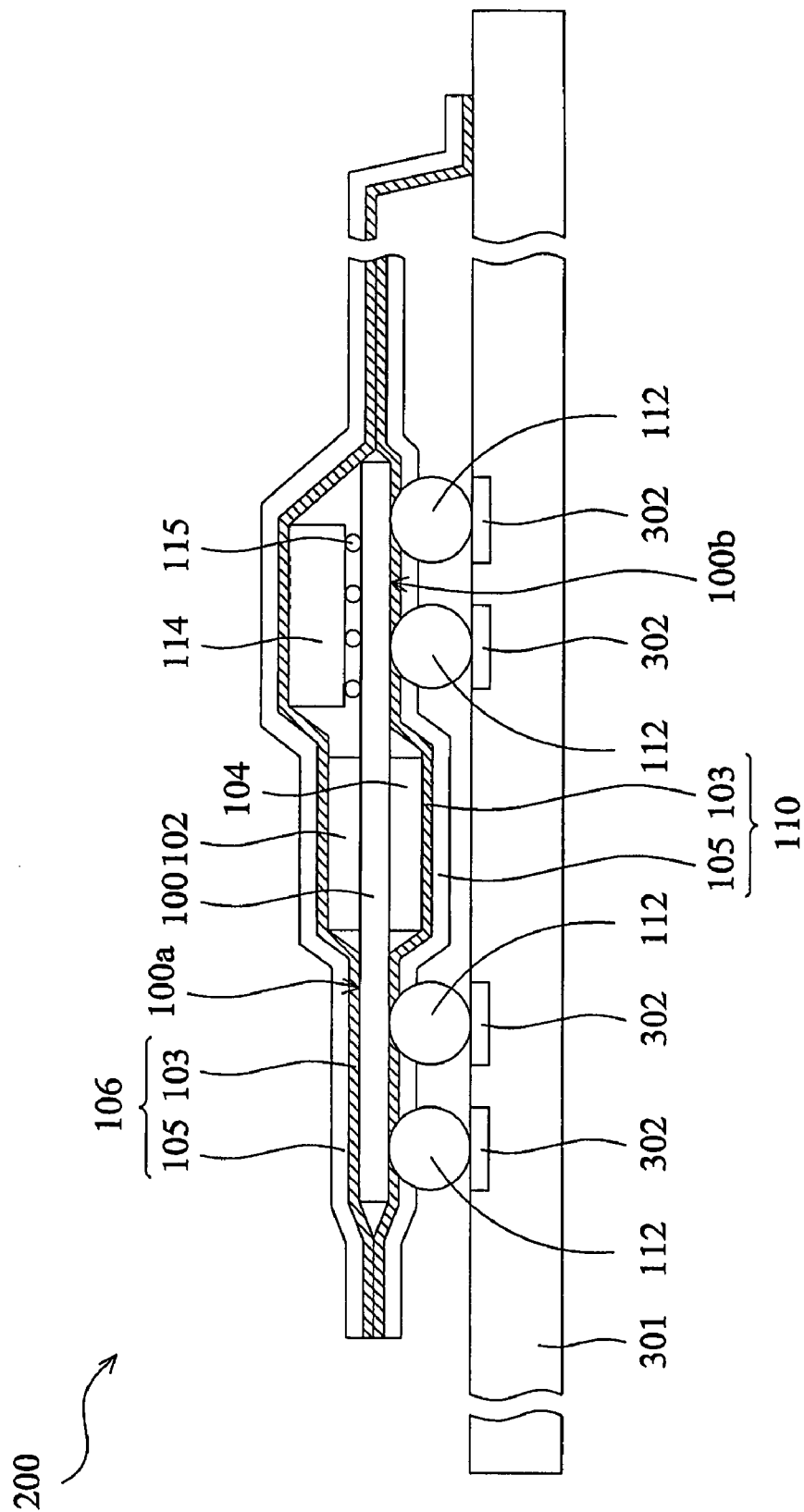
FIG. 8 is a cross-section of an embodiment of an electronic device with a package module according to the invention.

Additionally, in the embodiments, the package module 200 may be a multi-package module (MPM) with dice 102 and 104. In some embodiments, a package device 114 may be disposed between the substrate 100 and the flexible heat spreader 106 of the package module 200. The package device 114 is bonded to the substrate 100 through the bumps 115, thereby forming a package on package (POP) module, as shown in FIG. 8.

Figure 9:
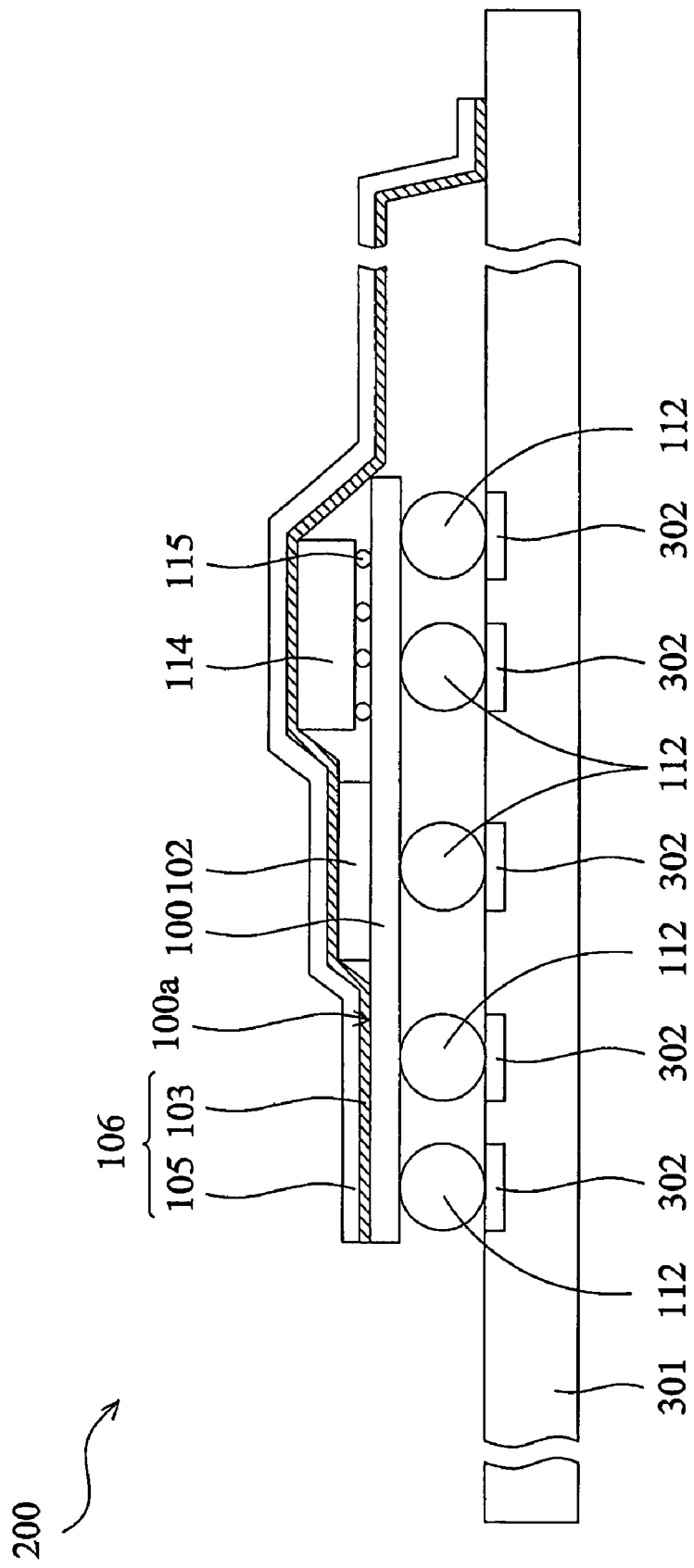
FIG. 9 is a cross-section of another embodiment of an electronic device with a package module according to the invention.

Additionally, although an exemplary embodiment of a multi-package module 200 comprising dice 102 and 104 and the corresponding flexible heat spreaders 106 and 110 is depicted, it will be apparent to those skilled in the art that the multi-package module 200 may comprise a single chip 102 and the corresponding flexible heat spreader 106 only (not shown). In this case, the package device 114 may be disposed between the substrate 100 and the flexible heat spreader 106 of the package module 200 to form a POP module, as shown in FIG. 9.

According to these embodiments, since heat generated from the die 104 on the lower surface 100b of the substrate 200 can be dissipated by the heat spreader 110, the die 104 can be a high power die, such as a central processing unit (CPU) die, in circuit design. That is, circuit design is more flexible. Moreover, since the thermal stress generated from the thermal processes can be reduced by the flexible heat spreaders 106 and 110, delamination of the heat spreader and crack of the dice can be prevented, thereby increasing device reliability. Additionally, since the utilization of the flexible heat spreaders 106 and 110 does not need the additional stiffener for fixing and holding the heat spreaders 106 and 110, manufacturing costs can be reduced.

While the invention has been described by way of example and in terms of preferred embodiment, it is to be understood that the invention is not limited thereto. To the contrary, it is intended to cover various modifications and similar arrangements (as would be apparent to those skilled in the art).

Therefore, the scope of the appended claims should be accorded the broadest interpretation so as to encompass all such modifications and similar arrangements.

What is claimed is:

1. A package module, comprising:
   a substrate having a first surface comprising a first die region;
   a first die disposed in the first die region of the first surface on the substrate; and
   a first flexible heat spreader conformally covering and directly contacting with the first surface of the substrate and the first die, one end of the first flexible heat spreader is bonded to a circuit board.

2. The package module as claimed in claim 1, wherein the substrate further comprises a second surface opposite to the first surface, wherein the second surface comprises a second die region and at least one thermal channel region outwardly extending to an edge or corner of the substrate from an edge or corner of the second die region.

3. The package module as claimed in claim 2, further comprising:
   a second die disposed in the second region of the second surface on the substrate; and
   a second flexible heat spreader conformally covering the thermal channel region and the second die;
   wherein the first and second flexible heat spreaders outwardly extend from at least one edge of the substrate and bond together.

4. The package module as claimed in claim 3, wherein each of the first and second flexible heat spreaders comprises:
   a flexible thermally conductive layer; and
   an adhesion layer interposed between the substrate and the flexible thermally conductive layer.

5. The package module as claimed in claim 4, wherein the flexible thermally conductive layer comprises a metal with a thickness less than 30 μm or a carbon tube prepreg material e.

6. The package module as claimed in claim 4, wherein each of the first and second flexible heat spreaders comprises a nickel or anode oxide layer on the flexible thermally conductive layer and separated from the adhesion layer by the flexible thermally conductive layer.

7. The package module as claimed in claim 4, wherein the surface of the flexible thermally conductive layer comprises a plurality of convex patterns, such that the plurality of convex patterns passes through the adhesion layers and directly contacts the first and second dice when the first and second flexible heat spreaders are bonded to the substrate by pressure.

8. The package module as claimed in claim 4, wherein the adhesion layer comprises B-stage resin or polyimide.

9. The package module as claimed in claim 1, further comprising a package device disposed between the substrate and the first flexible heat spreader.

10. An electronic device, comprising:
    a package module, comprising:
    a substrate having a first surface and an opposing second surface, wherein the first surface comprises a first die region;
    a plurality of solder balls on the second surface of the substrate arranged in an array;
    a first die disposed in the first die region of the first surface on the substrate;
    a first flexible heat spreader conformally covering and directly contacting with the first surface of the substrate and the first die; and
    a circuit board having a plurality of bonding pads correspondingly bonded to the plurality of solder balls.

11. The electronic device as claimed in claim 10, wherein the second surface comprises a second die region and at least one thermal channel region outwardly extending to an edge or corner of the substrate from an edge or corner of the second die region, and the plurality of solder balls are arranged on the second surface of the substrate except in the second die region and the thermal channel region.

12. The electronic device as claimed in claim 11, wherein the package module further comprises:
    a second die disposed in the second region of the second surface on the substrate; and
    a second flexible heat spreader conformally covering the thermal channel region and the second die;
    wherein the first and second flexible heat spreaders outwardly extend from at least one edge of the substrate and bond together.

13. The electronic device as claimed in claim 12, wherein an interval between the solder balls is narrower than a width of the thermal channel region.

14. The electronic device as claimed in claim 11, wherein the package module further comprises:
    a flexible thermally conductive layer; and
    an adhesion layer interposed between the flexible thermally conductive layer and the substrate.

15. The electronic device as claimed in claim 14, wherein the flexible thermally conductive layer comprises a metal with a thickness less than 30 μm or a carbon tube prepreg material.

16. The electronic device as claimed in claim 14, wherein each of the first and second flexible heat spreaders comprises a nickel or anode oxide layer on the flexible thermally conductive layer and separated from the adhesion layer by the flexible thermally conductive layer.

17. The electronic device as claimed in claim 14, wherein the surface of the flexible thermally conductive layer comprises a plurality of convex patterns, such that the plurality of convex patterns passes through the adhesion layers and directly contacts the first and second dice when the first and second flexible heat spreaders are bonded to the substrate by pressure.

18. The electronic device as claimed in claim 14, wherein the adhesion layer comprises B-stage resin or polyimide.

19. The electronic device as claimed in claim 12, wherein the first or second flexible heat spreader has an end bonding to the circuit board.

20. The electronic device as claimed in claim 10, wherein the package module further comprises a package device disposed between the first flexible heat spreader and the substrate.

* * * * *